(12) United States Patent
Tanoue et al.

(10) Patent No.: US 7,482,875 B2
(45) Date of Patent: Jan. 27, 2009

(54) HIGH FREQUENCY POWER AMPLIFIER

(75) Inventors: Tomonori Tanoue, Machida (JP); Masami Ohnishi, Hachioji (JP)

(73) Assignee: Renesas Technology Corp., Tokyo (JP)

( * ) Notice: Subject to any disclaimer, the term of this patent is extended or adjusted under 35 U.S.C. 154(b) by 13 days.

(21) Appl. No.: 11/209,691

(22) Filed: Aug. 24, 2005

(65) Prior Publication Data

US 2006/0066406 A1   Mar. 30, 2006

(30) Foreign Application Priority Data

Sep. 30, 2004  (JP)  ............................... 2004-286456
Aug. 2, 2005   (JP)  ............................... 2005-223892

(51) Int. Cl.
*H03F 3/04*   (2006.01)
(52) U.S. Cl. ...................... 330/289; 330/277
(58) Field of Classification Search ................ 330/289, 330/305, 277, 294
See application file for complete search history.

(56) References Cited

U.S. PATENT DOCUMENTS

| | | | | |
|---|---|---|---|---|
| 3,441,879 A | * | 4/1969 | Tomcavage | ............... 333/28 R |
| 6,147,557 A | * | 11/2000 | Kakuta et al. | ............... 330/277 |
| 6,472,949 B1 | * | 10/2002 | Yamazaki et al. | ......... 333/81 R |
| 6,906,590 B2 | * | 6/2005 | Amano | ....................... 330/277 |
| 6,977,949 B2 | * | 12/2005 | Saito | ....................... 372/38.02 |
| 6,985,020 B2 | * | 1/2006 | Zhou | .......................... 327/317 |
| 2003/0218185 A1 | | 11/2003 | Ohbu et al. | .................. 257/197 |

FOREIGN PATENT DOCUMENTS

| | | |
|---|---|---|
| JP | 11-220334 | 8/1999 |
| JP | 2000-031746 | 1/2000 |
| JP | 2004-274430 | 9/2004 |

* cited by examiner

*Primary Examiner*—Robert Pascal
*Assistant Examiner*—Hieu P Nguyen
(74) *Attorney, Agent, or Firm*—Miles & Stockbridge P.C.

(57) ABSTRACT

The invention provides a wide-band, low-noise, and small-sized high frequency power amplifier that has small temperature dependence of the gain and is excellent in input matching. A parallel circuit consisting of a resistor whose resistance depends strongly on temperature and a conventional resistor is inserted serially into a signal path in an input matching circuit of an amplification unit, and resistances of the resistors are set to appropriate values, for example, about 2/3 times an input impedance of the amplification unit.

2 Claims, 12 Drawing Sheets

| Rn [Ω] | Rt [Ω] | Rn/Rin | Rt/Rin | Rp max/Rin | △PG [dB] |
|---|---|---|---|---|---|
| ∞ | 12.5 | – | 0.33 | 1.81 | 5.04 |
| 100 | 14.3 | 2.67 | 0.38 | 1.18 | 2.73 |
| 50 | 16.7 | 1.33 | 0.45 | 0.86 | 1.30 |
| 40 | 18.2 | 1.07 | 0.49 | 0.76 | 0.77 |
| 30 | 21.4 | 0.80 | 0.57 | 0.64 | 0.52 |
| 25 | 25 | 0.67 | 0.67 | 0.56 | 0.93 |
| 20 | 33.3 | 0.53 | 0.89 | 0.48 | 1.58 |

US 7,482,875 B2

HIGH FREQUENCY POWER AMPLIFIER

CLAIM OF PRIORITY

The present application claims priority from Japanese applications JP 2004-286456 filed on Sep. 30, 2004, and JP 2005-223892 filed on Aug. 2, 2005, the contents of which are hereby incorporated by reference into this application.

FIELD OF THE INVENTION

This invention relates to a high frequency power amplifier used for terminals for high frequency mobile communications, and more specifically, to a high frequency power amplifier whose temperature dependence of the gain is reduced.

BACKGROUND OF THE INVENTION

As this kind of the conventional example, JP-A No. 031746/2000 (Patent document 1) discloses a temperature compensation-type amplifier such that a parallel-type resistor attenuator consisting of a resistor and a thermistor is provided on the input side of an n-stage amplifier, and an isolator and/or an adjustment circuit is provided on the input side.

Moreover, as another conventional example, JP-A 220334/1999 discloses a semiconductor circuit such that a thermistor is used as a gate resistor of an FET and is operated so as to make a variation in Q value to the ambient temperature and a variation of a gain characteristic of a gain slope to the ambient temperature cancel out each other, so that a temperature variation of the gain slope characteristic when the ambient temperature varies is compensated.

[Patent Documents 1]

JP-A No. 031746/2000

[Patent Documents 2]

JP-A No. 220334/1999

SUMMARY OF THE INVENTION

In the power amplifier used for the high-frequency mobile communication terminal, it is necessary to control its output signal intensity using a pilot signal from a base station etc. Especially, in the case of the power amplifier used for a communication system, such as CDMA (Code Division Multiple Access), that requires linearity, generally the power amplifier operates at a fixed power gain (hereinafter referred to simply as "gain"), and controls output signal intensity by controlling the input signal intensity of the power amplifier. If the gain of the power amplifier has large temperature dependence, it is necessary to record data of the temperature dependence of the power amplifier gain in a control system of the communication terminal, and to control the input signal intensity according to the temperature of the communication terminal.

However, a process of acquiring the data of the temperature dependence of PG (Amplifier Gain) at the time of inspection of the communication terminal and recording it in the control system of the communication terminal takes a time to change the temperature of the terminal and also increases a terminal cost. Therefore, a power amplifier of small temperature dependence of the gain is being sought.

On the other hand, as other important characteristics that are required for the power amplifier used for the high frequency mobile communication terminal, there are enumerated excellent input matching, wide-band performance that the gain deviation is equal to or less than 1 dB in a transmission band, low-noise performance, and small size.

First, regarding input matching, if significant mismatching arises between a first-stage amplifier and the power amplifier, the first-stage amplifier may become unstable. Furthermore, in the case of a communication system, such as CDMA, that requires linearity, if significant mismatching arises between the first-stage amplifier and the power amplifier and electric power returns to the output of the first-stage amplifier, there may occur a case where the output of the first-stage amplifier will distort due to its effect and the linearity required for the terminal will be unable to be secured. As a degree of matching considered necessary to prevent these, it is preferable that the input reflection coefficient of the power amplifier is 0.2 or less.

Next, the wide band performance will be discussed. Similarly with the above-mentioned temperature dependence, frequency dependence of the amplifier gain is recorded at the time of inspection, and a control system reads the data date and performs output control at an actual operating time. If it is known beforehand that the gain deviation in the band is small, there is a merit that the control becomes possible with a smaller amount of control data.

Moreover, regarding a noise of the power amplifier, its maximum value is specified from necessity to reduce extraneous emission from the communication terminal, especially extraneous emission in a reception frequency (hereinafter referred to as Rx) band of the terminal. Generally, in the mobile communications, transmission frequencies (hereinafter referred to as Tx) are hundreds of MHz to about 2 GHz, and, on the other hand, the Tx band and the Rx band of the communication terminal are separated only by a few tens of MHz or so. Because of this, the amplifier-gain PG and a noise factor (hereinafter referred to, as "NF") of the power amplifier of the terminal in the Rx band is almost equal to the PG and the NF in the Tx band, respectively. Therefore, noise electric power produced in the Rx band is found by multiplying the power gain PG in the Tx band of the power amplifier by the NF (i.e., addition in dB representation).

For example, the specification of the W-CDMA system stipulates that radiation of the communication terminal in the Rx band should be equal to or less than −133 dBm/Hz. Since the gain required for the power amplifier for W-CDMA is 25 to 30 dB and thermal noise at room temperature is −174 dBm/Hz, the noise factor of 11 to 16 dB (in the case of PG=25 dB, NF≦16 dB stands from −174+NF+25≦−133) becomes necessary to satisfy the stipulation. Actually, when considering contribution of a noise from the amplifier in the prior stage to the power amplifier, variation at the time of manufacture, and temperature dependence of the terminal characteristics, it is necessary to secure a margin of about 6 dB at the minimum and the NF of the power amplifier is required to be 5 to 10 dB.

In terms of this requirement, Patent document 1 had a problem that the input reflection coefficient exceeded 0.2 and a problem that the necessity of an isolator hampered miniaturization of the power amplifier.

In Patent document 2, freedom of matching is small because an input matching circuit is constructed only with series elements. Especially, a real part of an impedance (hereinafter referred to as Rin) needs to be matched only using combined resistance formed by parallel connection of a thermistor and a conventional resistor. There was a problem that, since Rin of a transistor generally used for the input stage of a power amplifier is 5 Ω or less, the above-mentioned combined resistance needs to have a value of 45 Ω or more in order to match an input impedance to 50 Ω, and consequently the amount of gain attenuation in the input matching circuit became excessive and the noise factor became excessive due to the noise generated from the combined resistance.

In consideration of this, the object of this invention is to solve the above-mentioned problems and provide a wide-band, low-noise, and small-sized high frequency power amplifier that has small temperature dependence of the gain and is excellent in input matching.

Typical inventions among inventions disclosed in this specification are as follows. That is, the high frequency power amplifier according to this invention, comprising an amplifier unit with temperature dependence of the gain ($\Delta PG$), a parallel circuit consisting of a first resistor whose resistance depends on temperature strongly and a second resistor that is a conventional resistor, and a first circuit that has a temperature change ($\Delta G = \Delta PG \times K: -1 < K < 0$) that allows a loss by the temperature change of the resistance of the parallel circuit to cancel out a part of $\Delta PG$, wherein the first circuit is provided in series to a signal path on the input side of the amplifier unit so that a real part (Rin) of the input impedance becomes smaller than 50 $\Omega$, and representing a minimum value of the combined resistance Rp of the parallel circuit as Rpmin and a maximum value as Rpmax, the parallel circuit is configured in such a way that (Rpmin+Rin)/50>2/3 or (Rpmax+Rin)/50<1.5 holds.

According to the high frequency power amplifier of this invention, it becomes possible to provide a wide-band, low-noise, and small-sized high frequency power amplifier that has small temperature dependence of the gain and is excellent in input matching.

DETAILED DESCRIPTION OF THE PREFERRED EMBODIMENTS

Hereafter, embodiments of a high frequency power amplifier according to this invention will be described in detail with reference to attached drawings.

Embodiment 1

Figure 1:
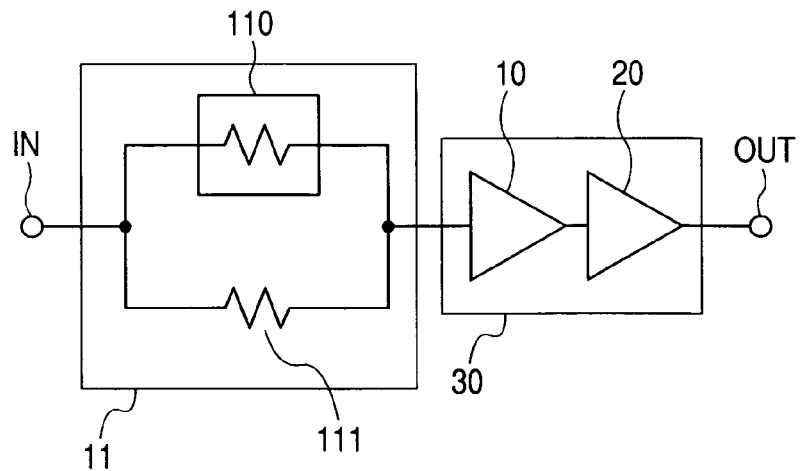
FIG. 1 is a circuit diagram showing a first embodiment of a high frequency power amplifier according to this invention.

FIG. 1 is a circuit diagram showing a first embodiment of a high frequency power amplifier according to this invention. In FIG. 1, the reference numeral 30 denotes an amplifier unit, and this amplifier unit 30 is constructed in a two-stage configuration consisting of a first-stage amplifier 10 and a second-stage amplifier 20. The reference numeral 11 denotes an attenuator that is a parallel circuit consisting of a thermistor 110 having negative temperature dependence of the resistance and a resistor 111 whose temperature dependence of the resistance can be ignored in a normal operating range (hereinafter referred to as the conventional resistor). When an operating temperature range of the high frequency power amplifier was set as −20° C. to 80° C., the temperature dependence of the gain of the amplifier unit 30 was that a gain per stage of the amplifier decreased by about −2 dB almost linearly to the temperature in a high temperature side, and the temperature dependence of the gain for the two stage amplifiers was −4 dB.

The necessary temperature compensation amount of the temperature deviation of the gain is determined by terminal specifications. In order to realize a temperature deviation within ±1 dB or less from a room temperature gain, values of the thermistor 110 and the resistor 111 were selected. A determination method is as follows. In a frequency band used for the high-frequency mobile communication terminal, the gain of the amplification unit 30 at room temperature must be limited to about 30 dB at the maximum in consideration of stability. Attenuation allowed for the attenuator 11 in order to realize a gain of 27.5 dB that is the middle between 25 dB that was mentioned as a gain required for the linear amplifier and 30 dB is 2.5 dB at room temperature. Now, the resistance of the thermistor 110 is represented by Rt, the resistance of the resistor 111 by Rn, and the combined resistance of the attenuator 11 that is the parallel circuit of the two elements by Rp. The input matching circuit of the amplification unit 30 is provided in such a way that the impedance when viewing toward the first-stage 10 of the amplification unit becomes a real number Rin. Because of existence of the attenuator 11, the input signal is divided so that the input voltage amplitude of the amplification unit is {Rin/(Rin+Rp)} times that of a case of absence of the attenuator. Since the electric power is its voltage amplitude squared, the following Equation 1 is obtained from the condition of the above-mentioned attenuation (−2.5 dB or less).

$$Rin/(Rin+Rp) \geq 0.75 \quad \text{(Equation 1)}$$

Modification of this equation gives the next Equation 2.

$$Rin \geq 3Rp \quad \text{(Equation 2)}$$

From this, if the combined resistance Rp is set so as to satisfy Rin=3Rp, the loss of the attenuator 11 will become −2.5 dB.

On the other hand, the dependence of the resistance Rt of the thermistor 110 on temperature T is expressed by the following Equation 3, providing that R=R0 Ω at temperature T0.

$$R = R0 \times \exp\{B(1/T - 1/T0)\} \quad \text{(Equation 3)}$$

Here, temperature is absolute temperature, and B is a constant determined by a thermistor material, its value being between about 1500 to 4500.

Figure 2:
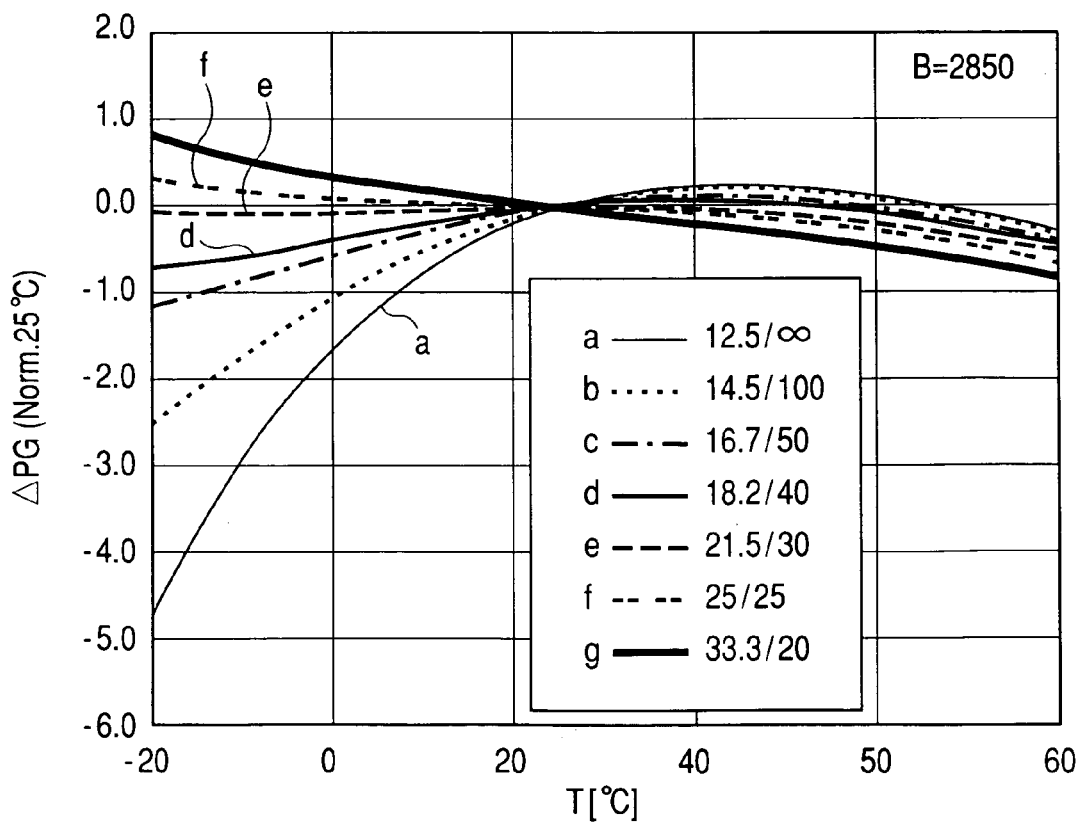
FIG. 2 is a diagram of temperature dependence of the gain deviation of the amplifier shown in FIG. 1.
Figures 3, 4:
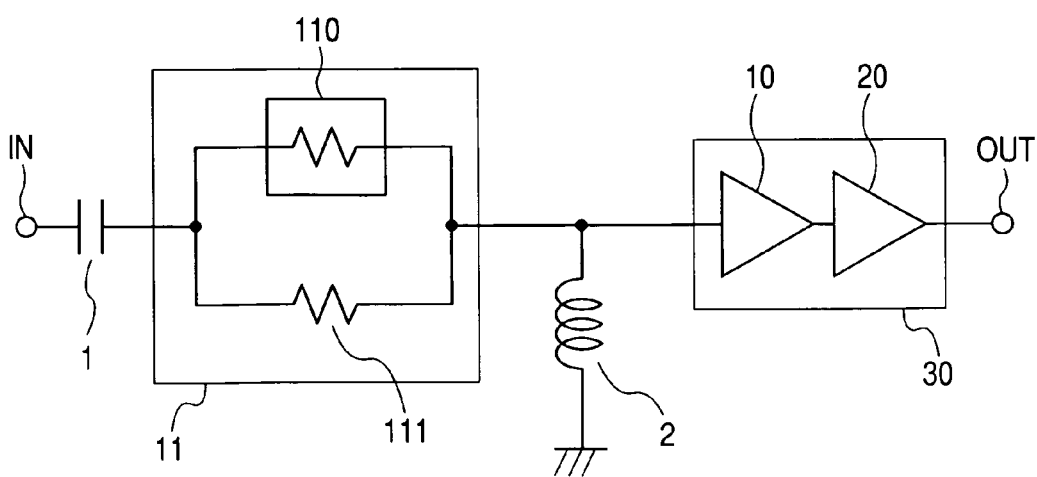
FIG. 3 is a mathematical table of the temperature dependence of the gain deviation shown in FIG. 2.
FIG. 4 is a circuit diagram showing a second embodiment of a high frequency power amplifier according to this invention.

Now, it was considered that the temperature characteristic of the resistance of the parallel resistor attenuator was brought closer to a linear characteristic by selecting suitably resistance Rt of the thermistor 110 and resistance Rn of the resistor 111. FIG. 2 shows a simulation result of temperature compensation of the gain in the case where a combination of Rt and Rn is changed in such a way that the attenuation may become −2.5 dB at 25° C. based on Equation 2. The graph shows the result with temperature T(° C.) on the horizontal axis and gain change ΔPG on the vertical axis, setting a gain compensation value at 25° C. to 0 dB. When only with the thermistor, that is, a value of the resistor 111 is infinite (characteristic line a), a change of the resistance on a low temperature side is excessive, generating temperature deviation of the gain of 5 dB or more in a temperature range of −20 to 80° C. On the other hand, when resistance of the parallel resistor is chosen to be in a range of 25 Ω to 40 Ω (characteristic lines d—f), it is possible to control the temperature deviation of the amplifier gain in a temperature range of −20 to 80° C. to be 1 dB or less. FIG. 3 shows a relationship between the temperature deviation ΔPG in a temperature range of −20 to 80° C. and resistance (a value normalized by Rin) of the parallel resistor attenuator at −20° C. for a combination of resistance of the thermistor 110 to resistance of the resistor 111 shown in FIG. 2.

By carrying out similar calculation more fully, it was found that, in order to confine the gain deviation with respect to the value at 25° C. within a range of ±1 dB, Rin needs to be within a range defined by the following Equation 4 and Equation 5.

$$0.46 < Rt/Rin < 1.06 \quad \text{(Equation 4)}$$

$$0.49 < Rn/Rin < 1.22 \quad \text{(Equation 5)}$$

Next, a noise when temperature compensation is conducted will be considered. Since a resistor is connected in series to 50 Ω of the signal source in this embodiment, the noise factor NF of the amplifier unit 30 degrades by (Rp+Rin)/Rin. Now, if the noise factor of the amplifier unit 30 is assumed to be 3 dB, allowable noise factor degradation is 2 dB to a noise factor of 5 dB required for the power amplifier. This corresponds to the maximum Rpmax, which is Rpmax<0.6Rin, of the combined resistance Rp. Detailed examination found that Rpmax<0.6Rin held in the range of the following Equation 6 and Equation 7.

$$Rn/Rin < 0.72 \quad \text{(Equation 6)}$$

$$Rt/Rin > 0.62 \quad \text{(Equation 7)}$$

When combining these equations with the above-mentioned Equation 4 and Equation 5, the following Equation 8 and Equation 9 were obtained. It was found that in order to realize the gain deviation within ±1 dB and the noise factor degradation of 2 dB or less, it is necessary to satisfy Equation 8 and Equation 9.

$$0.62 < Rt/Rin < 1.06 \quad \text{(Equation 8)}$$

$$0.49 < Rn/Rin < 0.72 \quad \text{(Equation 9)}$$

Input matching of the amplifier unit 30 at this time will be examined below.

Since the input impedance becomes a sum of Rp and Rin, representing a minimum of Rp by Rpmin, a minimum of the input impedance becomes [Rpmin+Rin] and its maximum becomes [Rpmax+Rin]. In a typical linear amplifier, it is required that a reflection coefficient of an input should be 0.2 or less, i.e., input standing-wave ratio (VSWR)<1.5 holds. Since VSWR is a value of an input impedance divided by the standard impedance, in order to satisfy VSWR<1.5, (Rpmin+Rin)>33.33 Ω and (Rpmax+Rin)<75 Ω are required to be satisfied.

Now, if Rin is set to a minimum input impedance that is allowable in terms of input matching, i.e., Rin=33.3 Ω is established, all conditions required by enumeration of Equation 8 and Equation 9 will be satisfied. Therefore, it was made clear that, for the case of B=2850 examined here, it was recommend to determine the value of Rt and Rn from the temperature deviation of the gain. Based on the above-mentioned examination, a temperature characteristic compensation-type amplifier was constructed with the following selection: a characteristics constant of the thermistor B=2850, Rt Rn=25 Ω, the combined resistance Rp=12.5 Ω, and Rin=37.5 Ω. As a result, the gain deviation of ±1 dB and the noise factor degradation of 2 dB or less were simultaneously realized as designed.

The earlier examination results shown in FIG. 2 and FIG. 3 are results in the case where the characteristics constant of the thermistor B=2850. Here, paying attention to the dependence of the constant B, in the case of B=4500, it becomes as shown by the following Equation 4a and Equation 5a, and the condition of the noise factor degradation <2 dB is satisfied at this time.

$$0.45 < Rt/Rin < 0.64 \quad \text{(Equation 4a)}$$

$$0.70 < Rn/Rin < 1.26 \quad \text{(Equation 5a)}$$

On the other hand, in the case of B=1500, the condition of gain deviation of ±1 dB is given by the following Equation 4b and Equation 5b.

$$1.39 < Rt/Rin \quad \text{(Equation 4b)}$$

$$0.70 < Rn/Rin < 1.26 \quad \text{(Equation 5b)}$$

However, the condition of noise degradation <2 dB is expressed by the following Equation 6a, which does not hold simultaneously with Equation 4b. Therefore, in the case of B=1500, the gain deviation of ±1 dB and the noise factor degradation of 2 dB or less cannot be realized simultaneously.

$$Rt/Rin < 1.33 \quad \text{(Equation 6b)}$$

Taking a general view of the foregoing, regarding a range of each individual resistance of the thermistor 100 and the resistor 111, the condition cannot be defined easily depending on the temperature dependence constant B of the thermistor 110, but regarding a range of the combined resistance Rp, the following condition are necessary. First, when an input impedance of up to 75 Ω is allowed, Rp<19 Ω is needed at room temperature from Equation 2. Moreover, in order that the temperature dependence of the gain becomes a value at room temperature ±1 dB, a change of attenuation of the resistor attenuator 11 must be −1 to −3 dB. Furthermore, from a condition to satisfy Equation 2, it is necessary for the maximum value of a variation of the combined resistance Rp in a temperature range of room temperature to the low temperature to be 31 Ω or less.

According to this embodiment, two elements of the thermistor 110 and the resistor 111 are added to the input of the amplifier unit 30 that has temperature dependence of the gain, and the input impedance of the amplifier unit is adjusted to a value that is smaller than the input impedance of the amplifier unit and within a condition of specifications of input VSWR (for example, 33.3 Ω), and the resistances of the thermistor 110 and the resistor 11 are optimized (for example, a value of 2/3 times the input impedance of the amplifier is used for each of them), whereby a low-noise high frequency power amplifier that has smaller temperature dependence of the gain and is excellent in input matching can be provided.

Embodiment 2

FIG. 4 is a circuit diagram showing a second embodiment of a high frequency power amplifier according to this invention. This embodiment differs from Embodiment 1 shown in FIG. 1 in that a series capacitor 1 is provided between the attenuator 11 consisting of the parallel resistors and the input terminal IN and an inductor 2 connected parallel between the attenuator 11 and the amplifier unit 30 is provided. The series capacitor 1 and the parallel inductor 2 constitute an input matching circuit of the amplifier along with the parallel resistor attenuator 11.

A situation of the matching will be described using the Smith chart of FIG. 5. An impedance when viewing the amplifier unit 30 from its input side is represented by A. The parallel inductor 2 converts the impedance on an equi-admittance circle and the impedance when viewing the amplifier side from a junction point of the parallel inductor 2 and the parallel resistor attenuator 11 becomes B.

Next, the parallel resistor attenuator 11 converts the impedance on an equi-reactance circle, and the impedance when viewing the amplifier side from a junction point of the parallel resistor attenuator 11 and the series capacitor 1 becomes C. Furthermore, the series capacitor 1 converts the impedance on an equi-resistance circle; finally the impedance is converted to the standard impedance, i.e., 50 Ω in D.

Now, for the amplifier unit whose impedance at point A is 2–j7 Ω, the following selection was done: 0.6 nH for inductance of the inductor 2, 24 Ω for the combined resistance Rp, and 30 pF for capacitance of the capacitor 1. As a result, 50 Ω matching was achieved in 1.95 GHz that is the center frequency of the band of W-CDMA.

The temperature characteristic compensation effect of the parallel resistor attenuator in this embodiment is fundamentally the same as Embodiment 1. However, it differs from Embodiment 1 in that the input impedance of the amplifier unit 30 is not necessarily only a resistance component, and even if the impedance contains a reactance component, the matching can be achieved.

Figure 5:
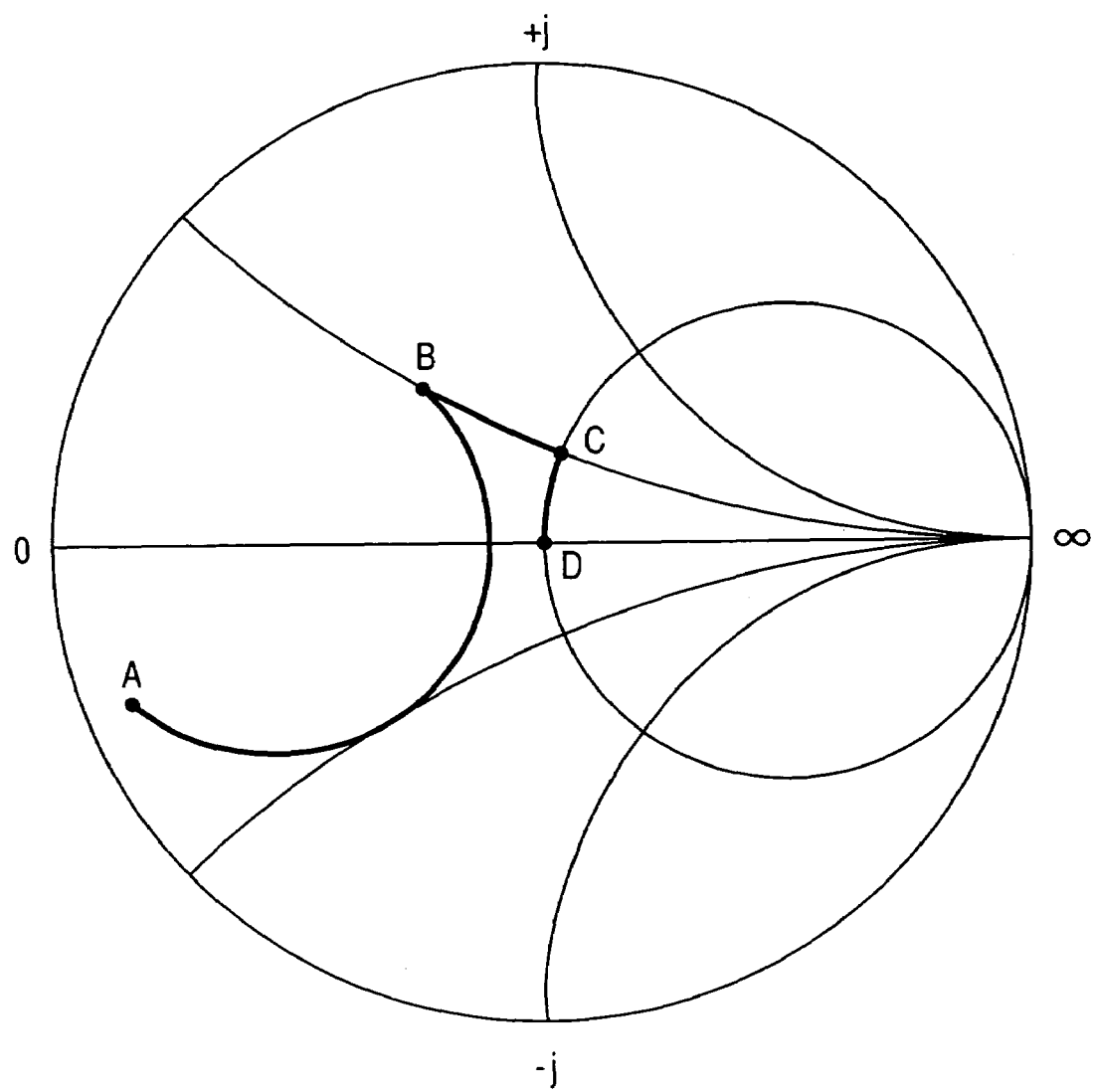
FIG. 5 is a Smith chart that shows input matching of an input matching circuit in FIG. 4.

The temperature characteristic compensation effect arises from a fact that a division ratio at which the input signal is divided by the impedance at point B shown in FIG. 5 and the resistance Rp of the parallel resistor attenuator has a temperature dependence resulting from temperature dependence of the resistance Rp. Representing the resistance of the parallel resistor attenuator 11 by Rp, a real part of the impedance B by Rin, and an imaginary part thereof by Xin, the division ratio becomes $[(Rin^2+Xin^2)/\{(Rp+Rin)^2+Xin^2\}]^{0.5}$. As the ratio of electric powers is a square of the ratio of voltages, the electric power ratio is expressed with the following Equation 10.

$$[(Rin^2+Xin^2)/\{(Rp+Rin)^2+Xin^2\}]$$ (Equation 10)

Figure 6:
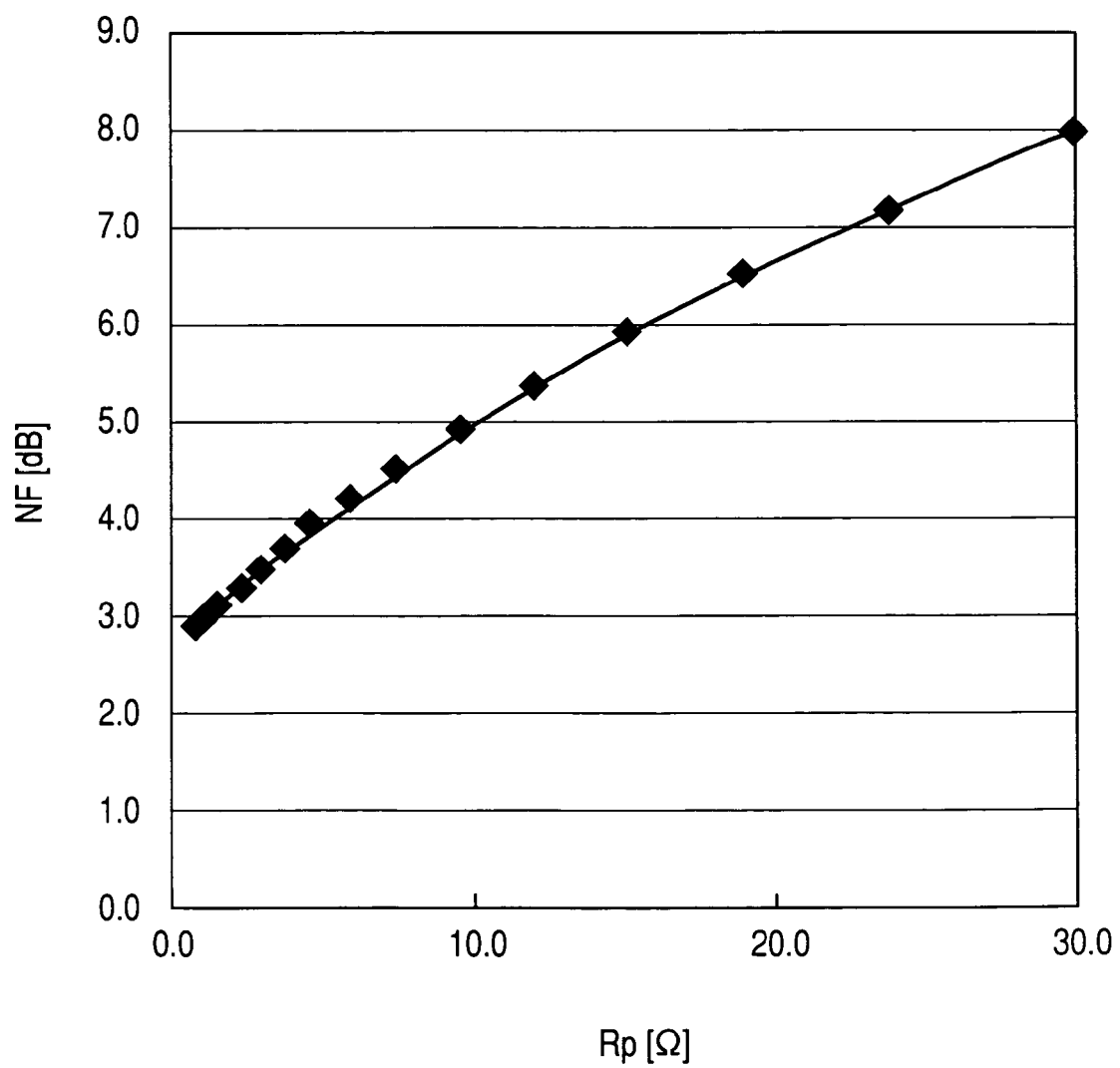
FIG. 6 is a diagram showing series resistor dependence of a noise of the amplifier in FIG. 4.

Regarding reduction in the temperature deviation of gain of the amplifier, similar discussion stands, with an only difference in the equation of the power ratio to Embodiment 1. However, regarding the noise, simple discussion in Embodiment 1 does not stand. In order to examine the point, the amplifier that used bipolar transistors was analyzed by circuit simulation with intention to find a relationship between the noise factor NF and the combined resistance Rp [Ω]. FIG. 6 showed the result. An input impedance of the amplifier unit is 6.6–j7 Ω. FIG. 6 indicates that when the combined resistance is about 10 Ω, the noise factor NF reaches 5 dB, which means that it is necessary to realize Rp <10 Ω.

Generally, the input impedance of the transistor for power amplifier is low compared to 50 Ω, and often reached 10 Ω or less. Therefore, if a real part of the impedance is intended to be matched only with a series resistor as in Patent document 2, the loss and noise will become excessive. In this embodiment, by performing impedance conversion first, using the parallel inductor 2, a low impedance state A was changed into a state of a somewhat higher impedance B, and then by inserting the parallel resistor attenuator 11, it was made possible to prevent excessive loss from occurring.

According to the configuration of this embodiment, the following effects arise in addition to the above-mentioned effect. First, since the series capacitor 1 blocks an external direct current (dc) electric potential in the input, and consequently the external dc voltage is not applied to the input of the amplifier; therefore, an operation of the amplifier unit is stabilized. Furthermore, when disturbances, such as a surge by electrostatic discharge, are applied to the input terminal and its alternate current component is inputted through the series capacitor 1, the parallel inductor 2 grounds the disturbance signals; therefore, disturbance voltage is not applied to the input terminal of the amplifier unit, and thus it is possible to protect the amplifying element from breakdown.

Figure 7:
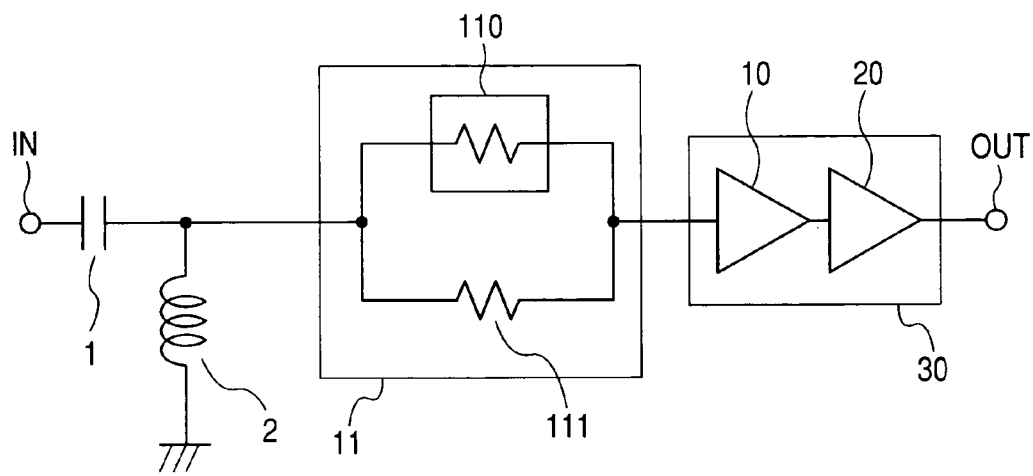
FIG. 7 is a circuit diagram showing a modification example of the amplifier of Embodiment 2.

Note that in the configuration of this embodiment, even if the parallel resistor attenuator 11 is counterchanged with the parallel inductor 2, as shown in FIG. 7, the same effect can be obtained. In this case, although values of individual elements need to be changed because a type of impedance matching is changed, impedance matching can be attained, as is the case of the circuit shown in FIG. 4.

Figure 8:
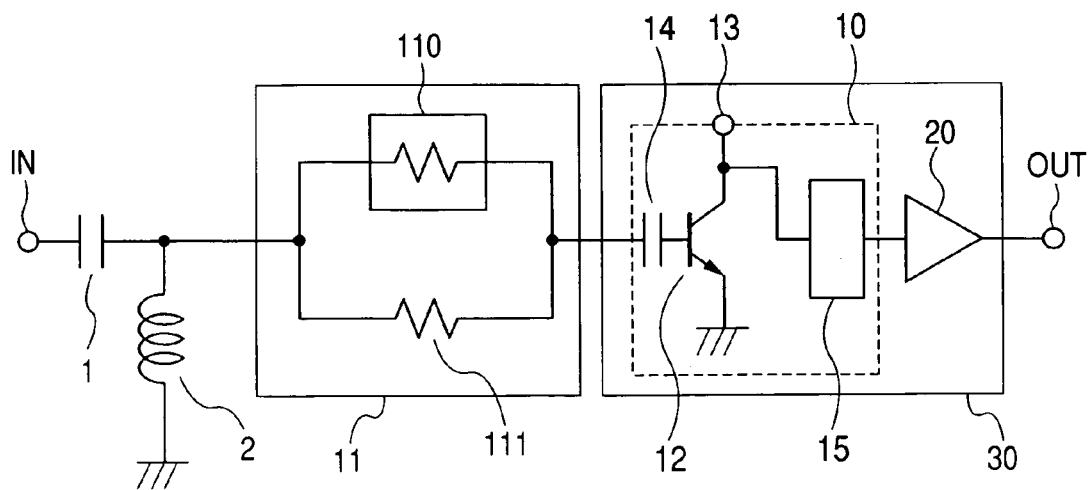
FIG. 8 is a circuit diagram showing an input part of a first-stage amplifier and a matching circuit in FIG. 7.

Moreover, in this embodiment, in the case where an element that operates only when a bias potential is applied to the input terminal, such as a bipolar transistor and an enhancement-type transistor, is used in an input stage of the amplifier unit 30, it becomes mandatory to insert an element for blocking a direct current between the parallel inductor 2 and the input terminal IN, i.e., a series capacitor. That is, it is necessary to take a configuration shown in FIG. 8. In FIG. 8, the reference numeral 14 denotes a capacitor for blocking a direct current signal, 12 denotes a first-stage transistor, 13 denotes a collector power terminal of the transistor, and 15 denotes an inter-stage matching circuit between the first-stage and second-stage amplifiers. Other symbols are the same as those of FIG. 4. Note that a bias system for supplying a dc voltage to the base is omitted. The bipolar transistor is used here. Any of the hetero-junction bipolar transistor, the MISFET, the MESFET, etc. may be used instead, but a capacitor 14 for blocking direct current is necessary as with the case of bipolar transistor, with one exception to be described later.

The exception is the case where the depletion-type transistor is used as an element of the input stage and operated with its gate being at the earth potential, that is, where it is used without applying a dc potential to the gate. In this case, since the gate of the FET is maintained at the circuit ground potential through the parallel resistor circuit 11 and the inductor 2, the series capacitor 14 becomes unnecessary.

Embodiment 3

Figure 9:
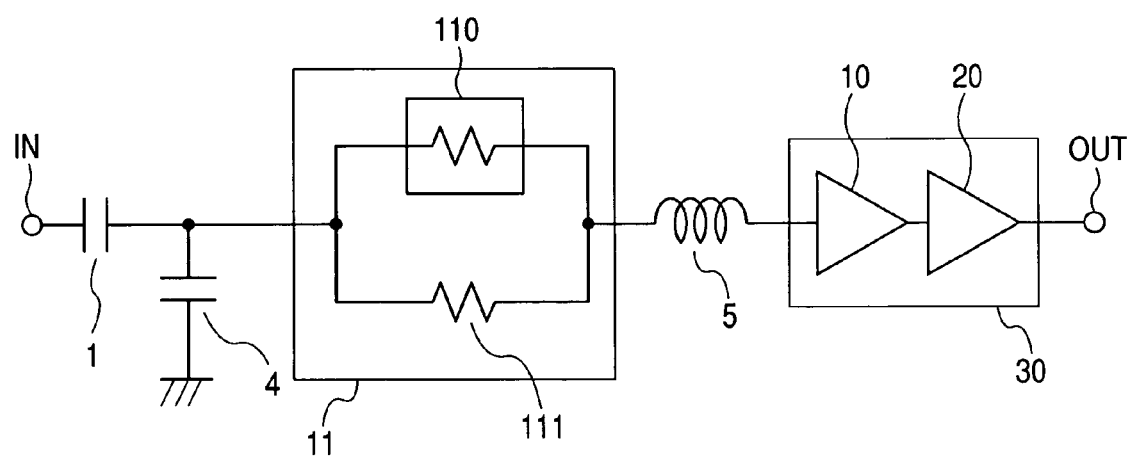
FIG. 9 is a circuit diagram showing a third embodiment of a high frequency power amplifier according to this invention.
Figure 10:
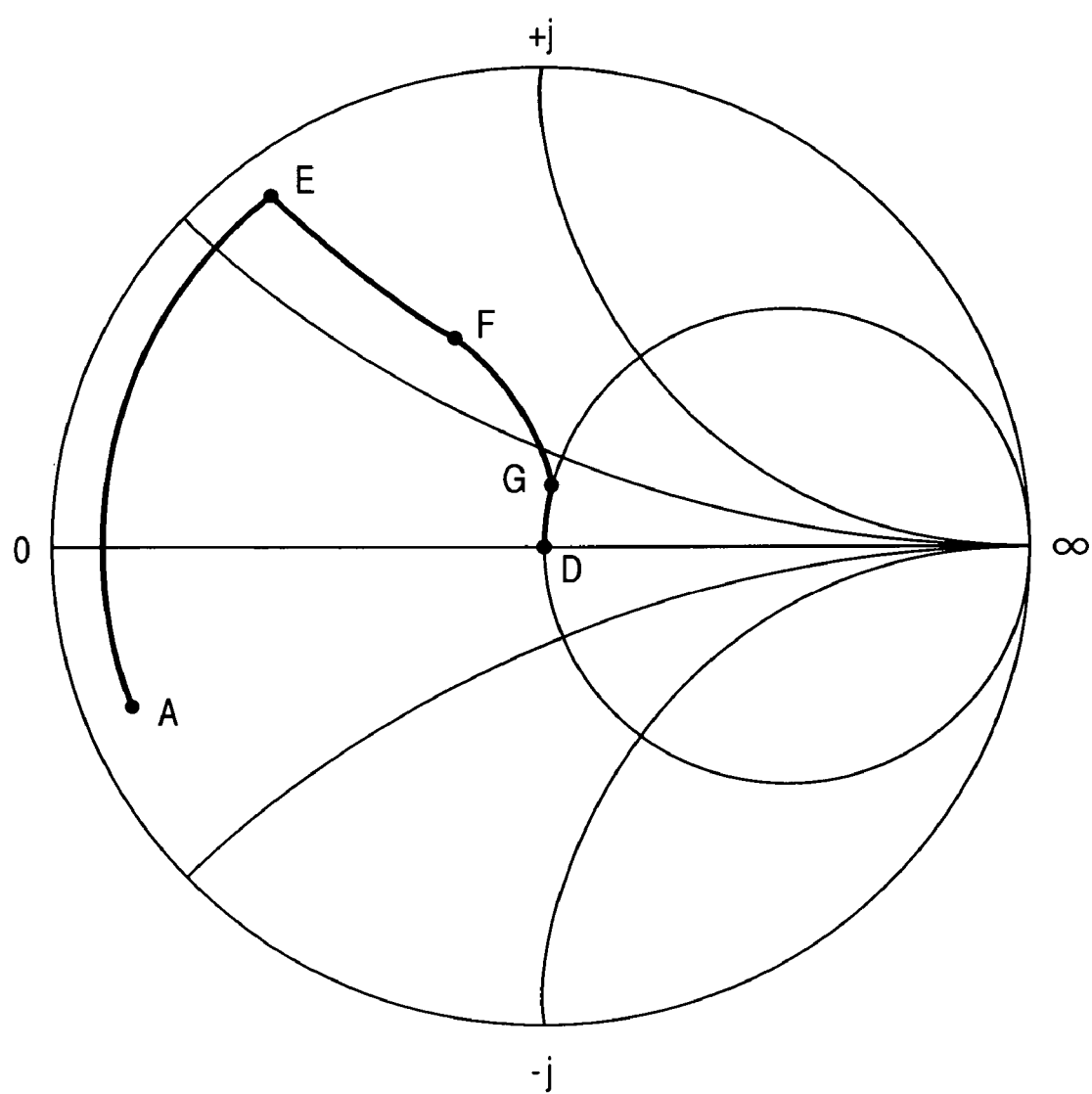
FIG. 10 is a Smith chart showing input matching of the input matching circuit of FIG. 9.

FIG. 9 is a circuit diagram showing a third embodiment of a high frequency power amplifier according to this invention. In this embodiment, a parallel capacitor 4 and a series inductor 5 are provided in-stead of the parallel inductor 2 in FIG. 7. Other reference numerals are the same as those of other figures. The parallel capacitor 4 and the series inductor 5 along with the parallel resistor attenuator 11 constitute an input matching circuit of the amplifier unit. The situation of the matching is explained using the Smith chart of FIG. 10. An impedance when viewing the amplifier unit 30 from the input side is represented by A. The series inductor 5 converts the impedance on an equi-resistance circle, an impedance when viewing the amplifier unit 30 side from a junction point of the series inductor 2 and the parallel resistor attenuator 11 becomes E.

Next, the parallel resistor attenuator 11 converts the impedance on an equi-reactance circuit, so that an impedance when viewing the amplifier unit side from the junction point of the parallel resistor attenuator 11 and the parallel capacitor 4 become F. Next, the parallel capacitor 4 converts the impedance on an equi-conductance circle, and the impedance becomes G. Then, the series capacitor 1 converts the impedance on an equi-resistance circle; finally the impedance is converted to the normalized impedance, namely 50 Ω.

Now, on the amplifier unit 30 whose impedance A is 2−j7 Ω, the series capacitor 1 of 6 pF, the parallel capacitor 4 of 2.4 pF, the combined resistance Rp of 10 Ω, and the inductor 5 of 2.4 nH were implemented. As a result, 50-Ω matching was attained in 1.95 GHz that was the center frequency of the band of W-CDMA.

Figure 11:
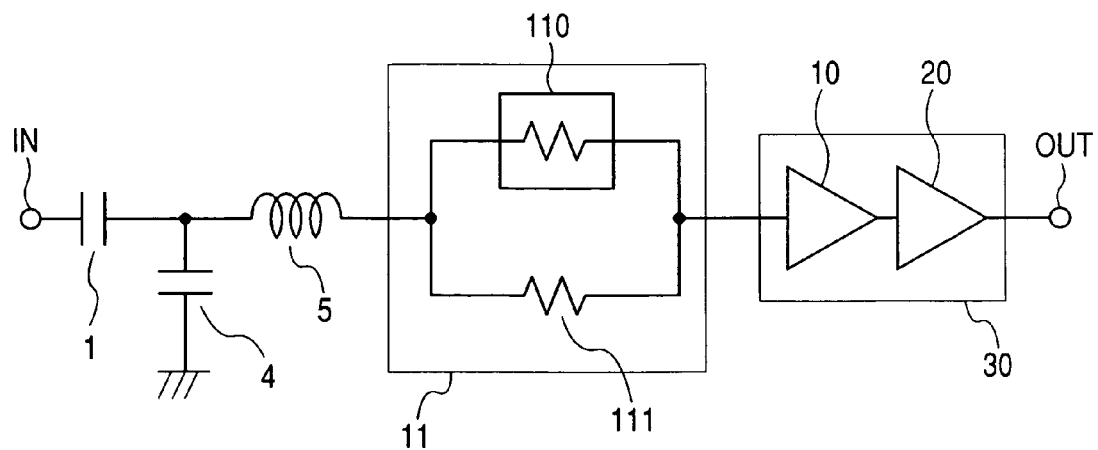
FIG. 11 is a circuit diagram showing a modification of the amplifier of Embodiment 3.

In this embodiment, even if the inductor 5 and the parallel resistor attenuator 11 that were connected in series are counterchanged to constitute a configuration shown in FIG. 11, 50-Ω matching can be realized with the completely same element values.

Moreover, the above-mentioned Equation 10 can be applied regarding the division ratio of voltage also in this embodiment.

The matching circuit of this embodiment differs in band characteristics from Embodiment 2 shown in FIG. 4 because the type is different, and has an effect that the configuration of this embodiment provides a wider band. Concretely, in the amplifier centering on 1.95 GHz, the configuration of Embodiment 2 gives a band of 80 MHz as a frequency band width where the gain decreases by 1 dB from a gain peak, whereas this embodiment gives a band of 210 MHz.

Moreover, since the signal input terminal IN of the attenuator 11 is isolated from the circuit ground and the input terminal by the series capacitor 1 and the parallel capacitor 4, the series capacitor 14 that is needed in the configuration of FIG. 8 shown in Embodiment 2 becomes unnecessary.

Embodiment 4

Figure 12:
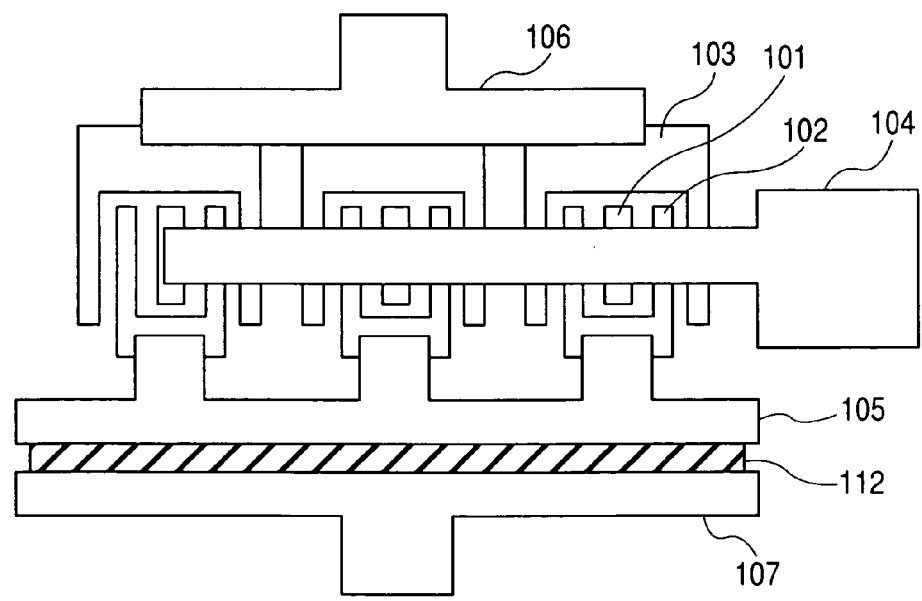
FIG. 12 is a circuit diagram showing a fourth embodiment of a high frequency power amplifier according to this invention.

FIG. 12 is a circuit diagram showing a fourth embodiment of a high frequency power amplifier according to this invention. This figure is a schematic diagram of a device chip into which transistors and an element equivalent to the parallel resistor attenuator in the circuit corresponding to FIG. 11 are integrated. In FIG. 12, the reference numeral 101 denotes an emitter electrode of the transistor, 102 denotes a base electrode, 103 denotes a collector electrodes, and FIG. 12 show three transistors each of a finger structure.

The reference numeral 104 denotes emitter wiring for connecting three emitter electrodes and further connecting to the earth potential outside the chip, 105 denotes base wiring for connecting three base electrodes and connecting to a resistor on the chip, 106 denotes collector wiring for connecting three collector electrodes and connecting to power supply potential outside the chip, 112 denotes a thin-film resistive element whose resistance has large temperature dependence, and 107 is an RF input terminal.

A manufacture method of the resistive element 112 is as follows.

First, in a resistive film formation process in normal integrated circuit manufacturing processes, a normal resistive film was formed and a thermistor film formation process was done. The thermistor film was deposited by sputtering in oxygen atmosphere using a target that has 70% of a material with a composition of $Mn_{1.3}Co_{1.3}CU_{0.6}O_4$ and 30% of $RuO_2$.

Next, the film was processed into a desired form by usual photolithography and ion milling, obtaining a two-layered resistor body. After covering the whole resistor body by a protective insulating film, the protective insulating film in the contact portion is removed by usual photolithography and dry etching, and a wiring layer was deposited over it to form contact to the resistor body. Dimensions of this layered resistive element 112 became 300 μm in width and 50 μm in length.

In this embodiment, two elements of the thermistor 110 and the resistor 111 that need to be mounted as individual component in Embodiments 1 to 3 are formed in a layered structure, whereby they are realized in a single component. Furthermore, by manufacturing that component by a semiconductor manufacturing process on the same semiconductor substrate as the amplifying element, it was possible to manufacture it within an area 1/20 or less times smaller than an area in the case where two chip components were used.

Moreover, a component mount area on the substrate was able to be decreased by 0.8 mm×1.0 mm, including two chip components each measuring 0.6 mm×0.3 mm and a component un-arrangeable area that extended to 0.1 mm outside its periphery, so that miniaturization of the amplifier area becomes possible.

Embodiment 5

Figure 13:
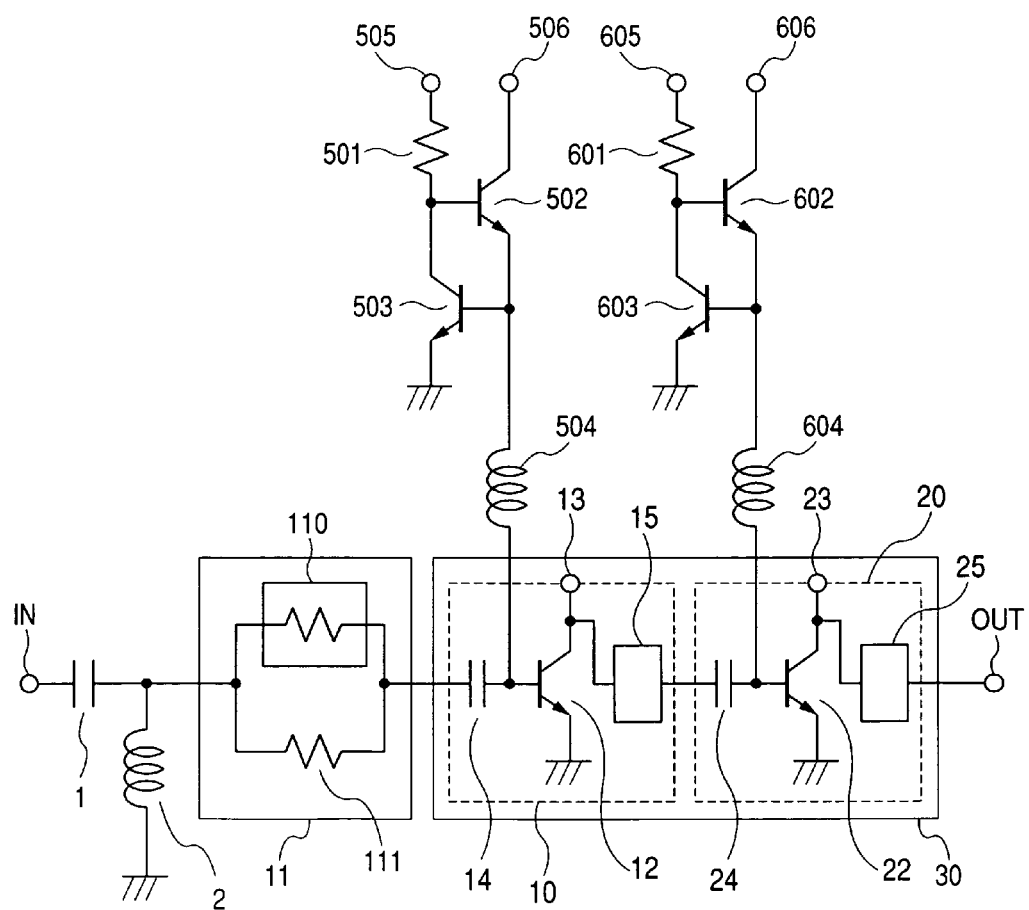
FIG. 13 is a circuit diagram showing a fifth embodiment of a high frequency power amplifier according to this invention.

FIG. 13 is a circuit diagram showing a fifth embodiment of a high frequency power amplifier according to this invention. This embodiment has a configuration that a temperature compensation circuit is used for a bias circuit of the transistors that constitute the circuit of the amplifier unit 30 in the circuits shown in FIG. 1.

In FIG. 13, the reference numerals 12 and 22 denote first-stage and second-stage transistors, respectively, 25 denotes an output matching circuit, 24 denotes an inter-stage coupling capacitor, 23 denotes a collector power terminal of the second-stage transistor, 501 denotes a first-stage bias resistor, 502 denotes an emitter follower transistor for supplying a first-stage bias current, 503 denotes a current mirror transistor for determining a first-stage bias current, 504 is an inductor for RF signal separation of the first-stage bias circuit, 505 denotes a first-stage bias control terminal, 506 denotes a first-stage bias-circuit power-supply terminal, 601 denotes a second-stage bias resistor, 602 denotes an emitter follower transistor for supplying a second-stage bias current, 603 denotes a current mirror transistor for determining a second bias current, 604 denotes an inductor for high frequency signal separation of the second-stage bias circuit, 605 denotes a second-stage bias control terminal, and 606 is a second-stage bias-circuit power-supply terminal.

In the bias circuit of this embodiment, as having a configuration of the so-called current mirror-type, a current proportional to a current flowing in the transistor 503 flows in the transistor 12, a current proportional to a current flowing in the transistor 603 flows in the transistor 22, respectively. Their proportional coefficients will become an emitter area ratio of the transistor 503 and the transistor 12 and an emitter area ratio of the transistor 603 and the transistor 22, respectively. In this embodiment, the amplifier was designed so that current gain of the transistors all became 100, emitter areas of the transistors 503 and 603 were set to 50 μm$^2$, the emitter area of the transistor 12 was set to 1000 μm$^2$, the emitter area of the transistor 22 was set to 4000 μm$^2$.

Moreover, the resistors 501 and 601 were set to 1000 Ω, and a voltage was set in such a way that current of 1 mA flowed into the bias terminals 505 and 605, respectively, at room temperature. In this circuit, since only 1/10000 times (an inverse of the current amplification factor squared) the currents of the transistors 12 and 22 flow in the bases of the emitter follower transistors 502 and 602, respectively, currents of almost 1 mA flow in the transistors 503 and 603, respectively, and currents of 20 mA and 80 mA flow in the transistors 12 and 22, respectively.

When device temperature changes, a junction voltage of a transistor exhibits temperature dependence of almost −1.3 mV/deg, but a change of its junction voltage is small compared to voltage drop of 1 V (=1 mA×1000 Ω) of the resistors 501 and 601, and consequently currents flowing in the resistors become almost constant; therefore, currents flowing in the transistors 12 and 22 become almost constant regardless of temperature. Since gain of an amplifier depends on the bias current and the gain increased with increasing current, temperature dependence of the gain can be compensated by increasing the bias current at high temperatures.

On the other hand, linearity of the linear amplifier depends on the bias current, and a bias current range in which high amplifier efficiency and linearity can be compatible with each other is narrow. An experiment conducted by the inventors of this invention has revealed that in the case where the temperature dependence of the gain is compensated by providing the bias current with temperature dependence, the linearity will degrade in high temperatures. Concretely, it has made clear that distortion increases at temperatures of 60° C. or higher and its linearity goes off a specification of the linearity in the amplifier for W-CDMA.

In the high frequency power amplifier using the parallel resistor attenuator 11 in the first-stage amplifier, temperature compensation of the gain of this embodiment was performed to keep the bias current almost constant, whereby this problem was solved; the distortion remained within the specification over the whole range of temperature, while a room temperature gain ±1 dB was maintained.

Embodiment 6

Figure 14:
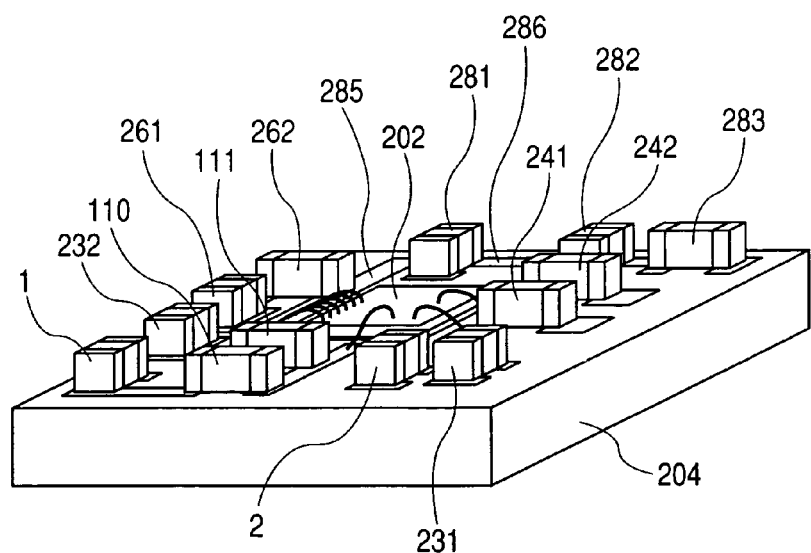
FIG. 14 is a perspective diagram of the high frequency power amplifier module of Embodiment 6.
Figure 15:
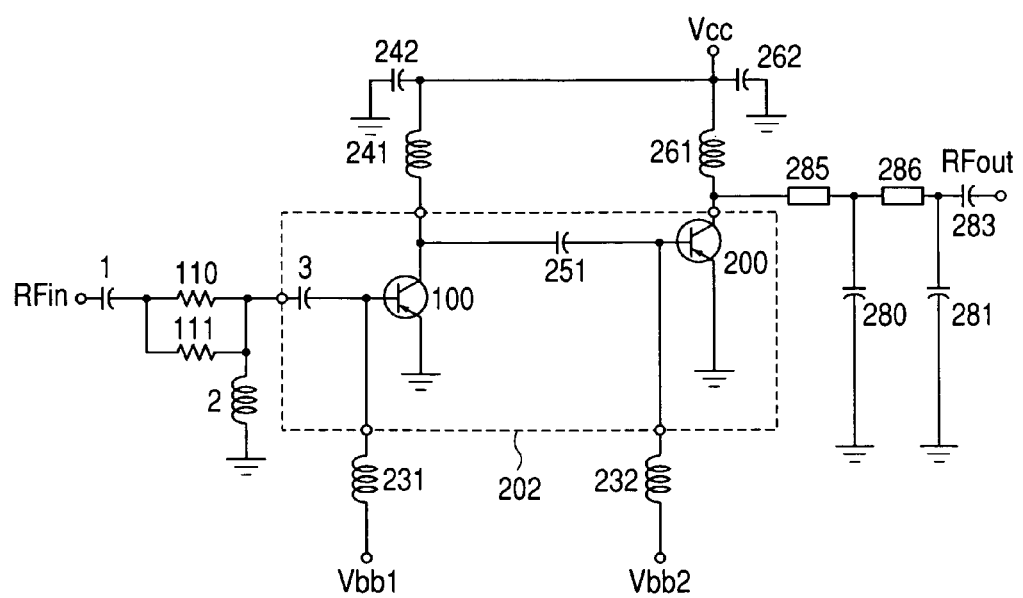
FIG. 15 is a circuit diagram of the high frequency power amplifier module of Embodiment 6.

A configuration of a sixth embodiment of this invention will be described using FIG. 14 and FIG. 15. FIG. 14 is a perspective view of a high frequency power amplifier module in which the high frequency power amplifier of Embodiment 2 of this invention is constructed in a single package, and FIG. 15 is its circuit diagram. In FIG. 15, the reference numerals 231 and 232 denote first-stage and final-stage RF signal isolation inductors that supply base bias voltages, respectively, 241 and 261 denote first-stage and final-stage choke inductors for power supply, respectively, 242 and 262 are bypass capacitors for stabilizing power supply voltage, 285 and 286 denote transmission lines for output matching, 280, 281, and 283 denote capacitors for output matching, and 100 denotes a first-stage amplification transistor. 200 denotes a final-stage amplification transistor, 202 denotes an MMIC into which the amplification transistor, the input coupling capacitor 3, and an inter-stage matching capacitor 251 are integrated, the symbol RFin denotes an RF signal input terminal, RFout denotes an RF output terminal, Vbb1 and Vbb2 denote are first-stage and final-stage base bias terminals, respectively, Vcc denotes a power terminal, and other components are represented by the same symbols as in Embodiment 2. As shown in FIG. 14, the high frequency power amplifier module was constructed in such a way that, regarding circuit elements other than elements integrated in the MMIC 202, elements other than the transmission line was mounted on a multi-layer ceramic substrate 204 in the form of a chip component, and the transmission line is formed as a conductor pattern on the substrate. For all the chip components, the so-called 0603 components each in foot-print dimensions of 0.6× 0.3 mm$^2$ are used. The dimensions of the MMIC 202 for amplification are 0.7-mm square, the module substrate is a five-layered alumina ceramics having a substrate thickness of 0.5 mm and substrate dimensions of 4-mm square. Dimensions of the module including resin sealing not illustrated in the FIG. 14 are 4×4× 1.4 mm$^3$.

Features of this embodiment are the following two points: by constructing the parallel resistor attenuator 11 consisting of the thermistor 110 and the resistor 111 with chip components, the amplifier is realized with an occupancy area of 1 mm$^2$ or less; and further by integrating the dc blocking capacitor 2 and the inter-stage matching capacitor 251 into the MMIC 202, the number of chip components is reduced, and the high frequency power amplifier module whose gain and linearity exhibit small temperature dependence is constructed within a small volume of 4×4×1.4 mm$^3$. The temperature characteristic compensation-type amplifier is constructed, as in the same way as Embodiment 1, by specifying the temperature dependence constant B of the thermistor to be 2850 and by selecting Rt=Rn=25 Ω, the combined resistance Rp=12.5 Ω, and Rin=37.5 Ω. As the temperature dependence of the gain of this module, again deviation of ±1 dB and degradation in the noise factor of 2 dB or less were simultaneously realized as designed.

As described in the foregoing, according to the configuration of this embodiment, the small-sized high frequency power amplifier with small temperature dependence of the gain can be provided. Note that, in this embodiment, the circuit of Embodiment 2 was constructed in the module. It is needless to say that it is possible to construct the circuit of Embodiment 3 in a module of the same volume because the number of elements that need to be arranged outside the MMIC 202, and consequently the number of chip components does not change and an area occupied by the chip components does not change. In addition, this embodiment used an alumina ceramic as a material of the substrate. As is clear in the above description, the substrate is used to allow the chip components to be mounted thereon, to provide wiring necessary to construct the amplifier, and to form the transmission line used for an output matching circuit. Therefore, it is natural that the similar module can be constructed with any of resin substrates, resign multi-layered substrates, etc., as long as a substrate can satisfy these functions. In that case, since a loss of the above-mentioned transmission line degrades the efficiency of the power amplifier, it is preferable that a transmission line material determining the loss of a transmission line and a substrate material constituting the transmission line have small dielectric dissipation factors.

Embodiment 7

Figure 16:
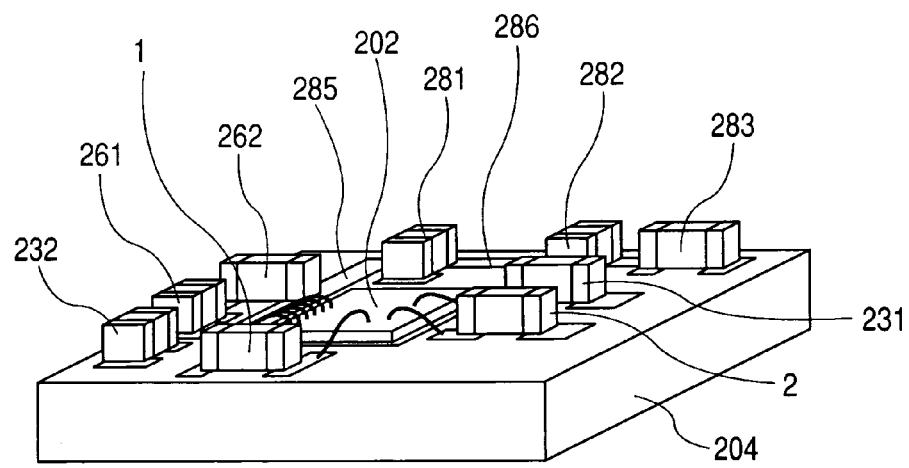
FIG. 16 is a perspective diagram of the high frequency power amplifier module of Embodiment 7.
Figure 17:
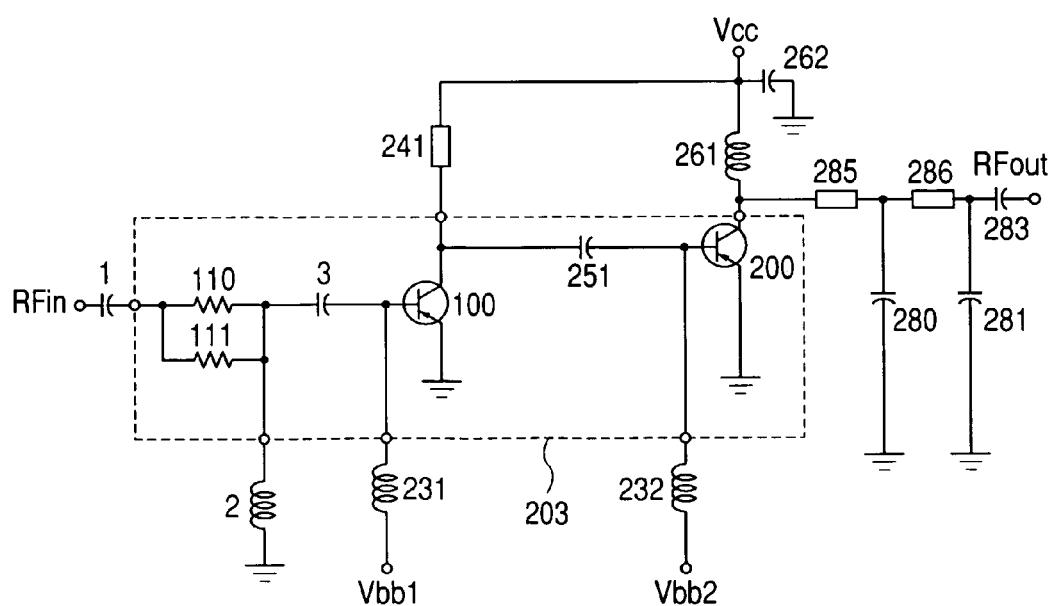
FIG. 17 is a circuit diagram of the high frequency power amplifier module of Embodiment 7.

FIG. 16 is a perspective view of a high frequency power amplifier module in which the circuit of Embodiment 4 was realized in a single package as with Embodiment 6, and FIG. 17 is its circuit diagram. In FIG. 15, the resistor 111 and the thermistor 110 arranged outside the MMIC 202 were integrated into an MMIC 203 in this embodiment. Because of this, although dimensions of the MMIC 203 increased to 0.7×0.9 mm², the parts to be mounted on the substrate 204 were reduced by two. In this embodiment, two chip components were further reduced by realizing the choke inductor 241 with a line in an internal layer of the substrate and omitting the bypass capacitor 242 for stabilization of supply voltage. Therefore, the module dimensions were able to be miniaturized to 4×3 mm². As described above, according to this embodiment, smaller-sized high frequency power amplifier with smaller temperature dependence of the gain and further with smaller temperature dependence of an idling current can be provided.

Embodiment 8

In Embodiment 6, the temperature characteristic compensation circuit of Embodiment 5 was applied as a base bias circuit, and the circuit was integrated into the MMIC 202. By this modification, although dimensions of the MMIC chip increased to 0.8×0.7 mm, larger than Embodiment 6, it became possible to keep idling current of the circuit at a fixed value while a voltage given to Vbb1 and Vbb2 is kept at a fixed value.

According to the configuration of this embodiment, a smaller-sized high frequency power amplifier with small temperature dependence of the gain and also with small temperature dependence of the idling current can be provided.

Embodiment 9

Figure 18:
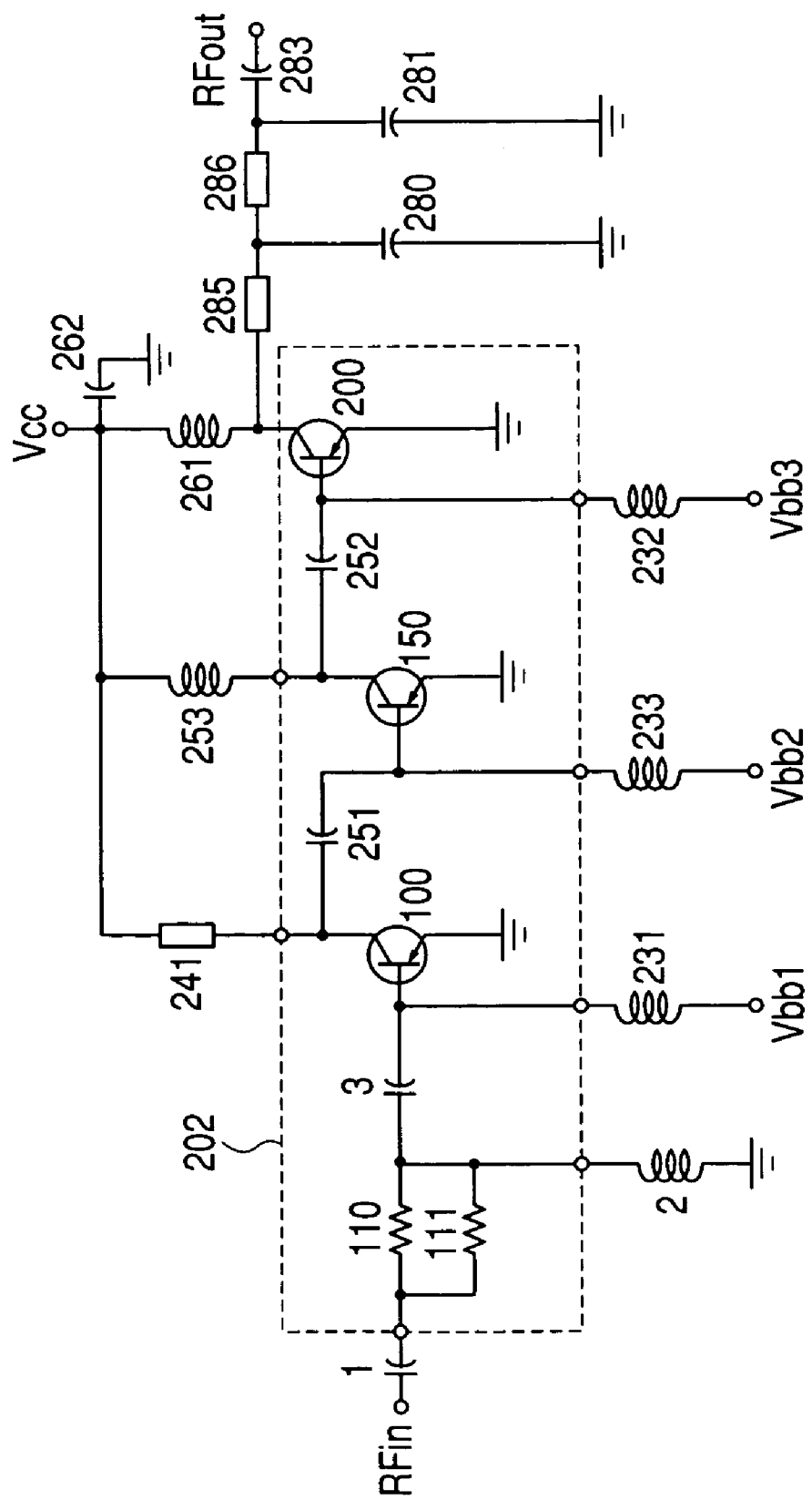
FIG. 18 is a circuit diagram of the high frequency power amplifier module of Embodiment 9.

In Embodiment 7, the circuit of the MMIC was changed as shown in FIG. 18, so that a three-stage amplifier was constructed. In FIG. 18, the reference numeral 150 denotes a second stage of amplifying element, 252 denotes a matching capacitor between the second stage and the third stage, 233 denotes an RF signal isolation inductor for supplying a first-stage base bias voltage, 253 denotes a choke inductor for a second-stage power supply, and circuit elements other than the above and their reference numerals are the same as Embodiment 7. By this modification, dimensions of the MMIC 203 increased to 0.9×0.8 mm, but merits described below were obtained. By configuring the amplification unit as the three-stage amplifier, the gain of the amplifier was increased; it becomes possible to achieve up to about 35 dB in this embodiment, increasing the gain in the second-stage amplifier in Embodiment 7, i.e., 25 dB. By this achievement, it becomes possible to reduce the output of the previous stage amplifier by up to 10 dB, and consequently it becomes possible to reduce significantly distortion of the previous stage amplifier. The distortion of the previous stage amplifier in the case where the amplifier module of Embodiment 7 was used was −40 dBc, whereas the 3GPP standard of adjacent channel power ratio (ACPR) of the W-CDMA signal is −33 dBc, and therefore the design margin was not sufficient. On the other hand, since the three-stage power amplifier of this embodiment can achieve the same output voltage even when the output of the previous stage output is reduced by 10 dB, it is possible to operate the previous stage amplifier in an output range where linearity is excellent. Therefore it becomes possible to achieve sufficient margin to the 3GPP standard, achieving ACPR of −45 dBc.

According to the configuration of this embodiment, a small-sized and high-gain high-frequency power amplifier with small temperature dependence of the gain can be provided.

What is claimed is:

1. A high frequency power amplifier, comprising:
an amplifier unit that has temperature dependence of gain;
a parallel circuit including a first resistor whose resistance depends strongly on temperature and a second resistor that is a conventional resistor;
said parallel circuit having a temperature change ($\Delta G = \Delta PG \times K$: $-1 < K < 0$) that allows a loss by the temperature change of the resistance of the parallel circuit to cancel out a part of temperature dependence ($\Delta PG$) of the gain of the amplifier; and
a first capacitor connected in series to a signal path between an input terminal and the parallel circuit; and
a first inductor connected in shunt configuration to a signal path between the parallel circuit and the amplifier unit.

2. The high frequency power amplifier according to claim 1, wherein
the first resistor is a resistor formed on a same semiconductor substrate as an amplifying element of the amplifier unit.

* * * * *